United States Patent
Weng et al.

(10) Patent No.: US 10,156,918 B2
(45) Date of Patent: Dec. 18, 2018

(54) IN-CELL TOUCH DISPLAY PANEL

(71) Applicant: HON HAI PRECISION INDUSTRY CO., LTD., New Taipei (TW)

(72) Inventors: Yu-Fu Weng, New Taipei (TW); Chien-Wen Lin, New Taipei (TW); Chia-Lin Liu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 220 days.

(21) Appl. No.: 15/245,917

(22) Filed: Aug. 24, 2016

(65) Prior Publication Data

US 2018/0059831 A1    Mar. 1, 2018

(51) Int. Cl.
| | |
|---|---|
| *G06F 3/041* | (2006.01) |
| *H01L 27/12* | (2006.01) |
| *G06F 3/044* | (2006.01) |
| *G02F 1/1333* | (2006.01) |

(52) U.S. Cl.
CPC ............ *G06F 3/0412* (2013.01); *G06F 3/044* (2013.01); *H01L 27/124* (2013.01); *G02F 1/13338* (2013.01); *G06F 2203/04112* (2013.01)

(58) Field of Classification Search
CPC ................... G06F 3/0412; G06F 3/044; G06F 2203/04112; H01L 27/124; G02F 1/13338
See application file for complete search history.

(56) References Cited

U.S. PATENT DOCUMENTS

| | | | |
|---|---|---|---|
| 2015/0085208 A1* | 3/2015 | Lee ...................... | G06F 3/0412 349/12 |
| 2017/0192614 A1* | 7/2017 | Lee ...................... | G06F 3/0412 |
| 2017/0255308 A1* | 9/2017 | Li ...................... | G02F 1/133345 |

* cited by examiner

*Primary Examiner* — Jonathan Boyd
(74) *Attorney, Agent, or Firm* — ScienBiziP, P.C.

(57) ABSTRACT

A TFT substrate comprising a first conductive layer, a first semiconductor layer, a second semiconductor layer, a second conductive layer formed over the first semiconductor layer, a first transparent layer, a third conductive layer, and a second transparent layer. The TFT substrate further comprises a plurality of touch sensor units. Each of the touch sensor units includes a plurality of first wires and a plurality of second wires crossed with the first wires. The first wires and the second wires are electrically connected each other for detecting touch operations at a position corresponding to a junction of the first wires and the second wires. Each of the touch sensor units comprises two sub-pixel electrodes and a TFT structure; the TFT structure simultaneously drives the two sub-pixels.

25 Claims, 14 Drawing Sheets

IN-CELL TOUCH DISPLAY PANEL

CROSS-REFERENCE TO RELATED APPLICATIONS

Field

The subject matter herein generally relates to touch-screens, and particularly to an in-cell touch display panel.

BACKGROUND

In-cell touch display technology is an important technology in touch sensing displays. An in-cell touch display panel is integrated with the touch structure in a cell of the display panel. However, the in-cell touch display can provide a better user experience by, for example, having a display thinner than an exterior touch display panel. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
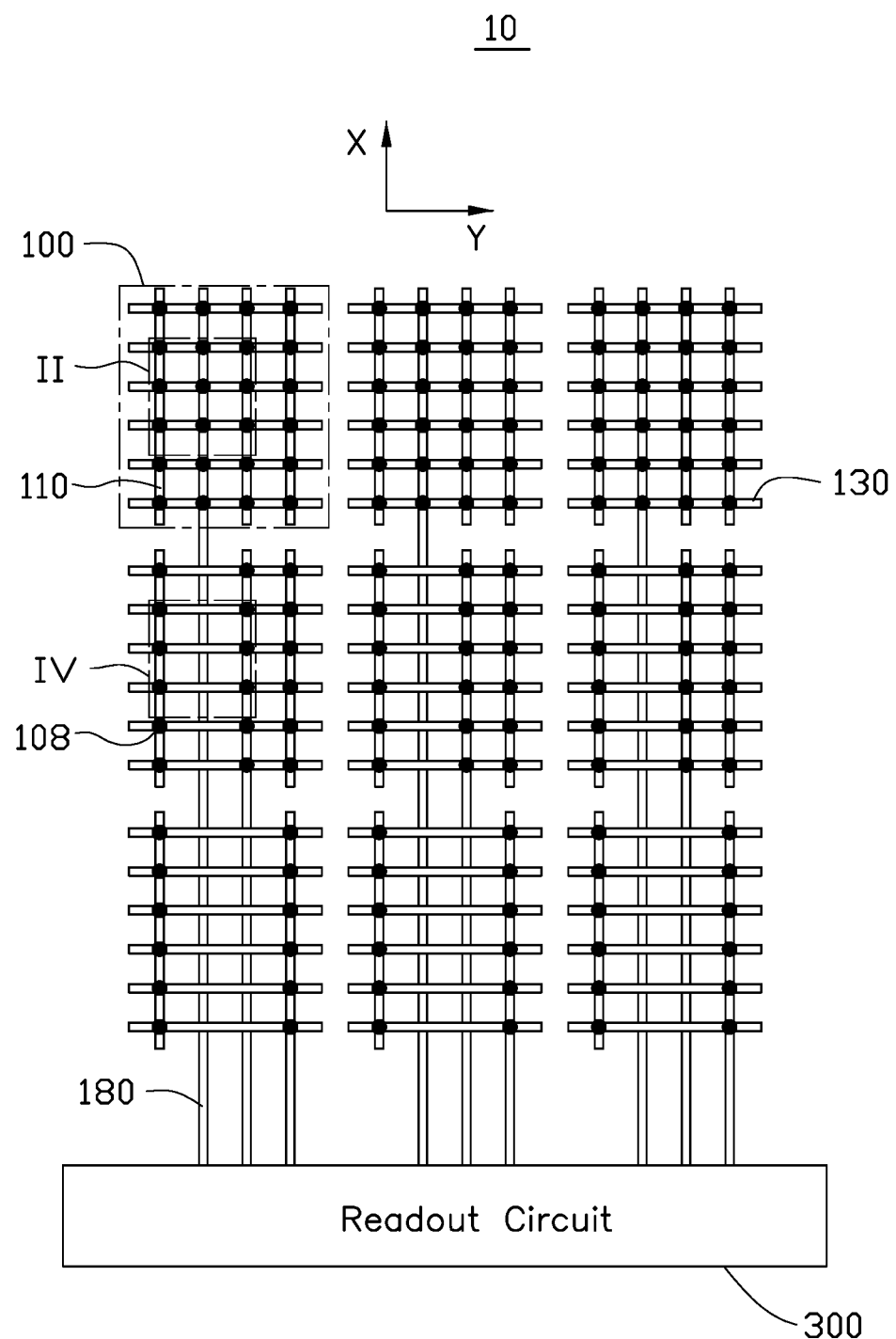
FIG. 1 is a plan view of an in-cell touch display panel according to a first exemplary embodiment, the in-cell touch display panel comprising a TFT structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features. The description is not to be considered as limiting the scope of the exemplary embodiments described herein.

The term "substantially" is defined to be essentially conforming to the particular dimension, shape or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Referring to FIG. 1, a layout of the structure of an in-cell touch display panel of an exemplary embodiment is shown.

Figure 6:
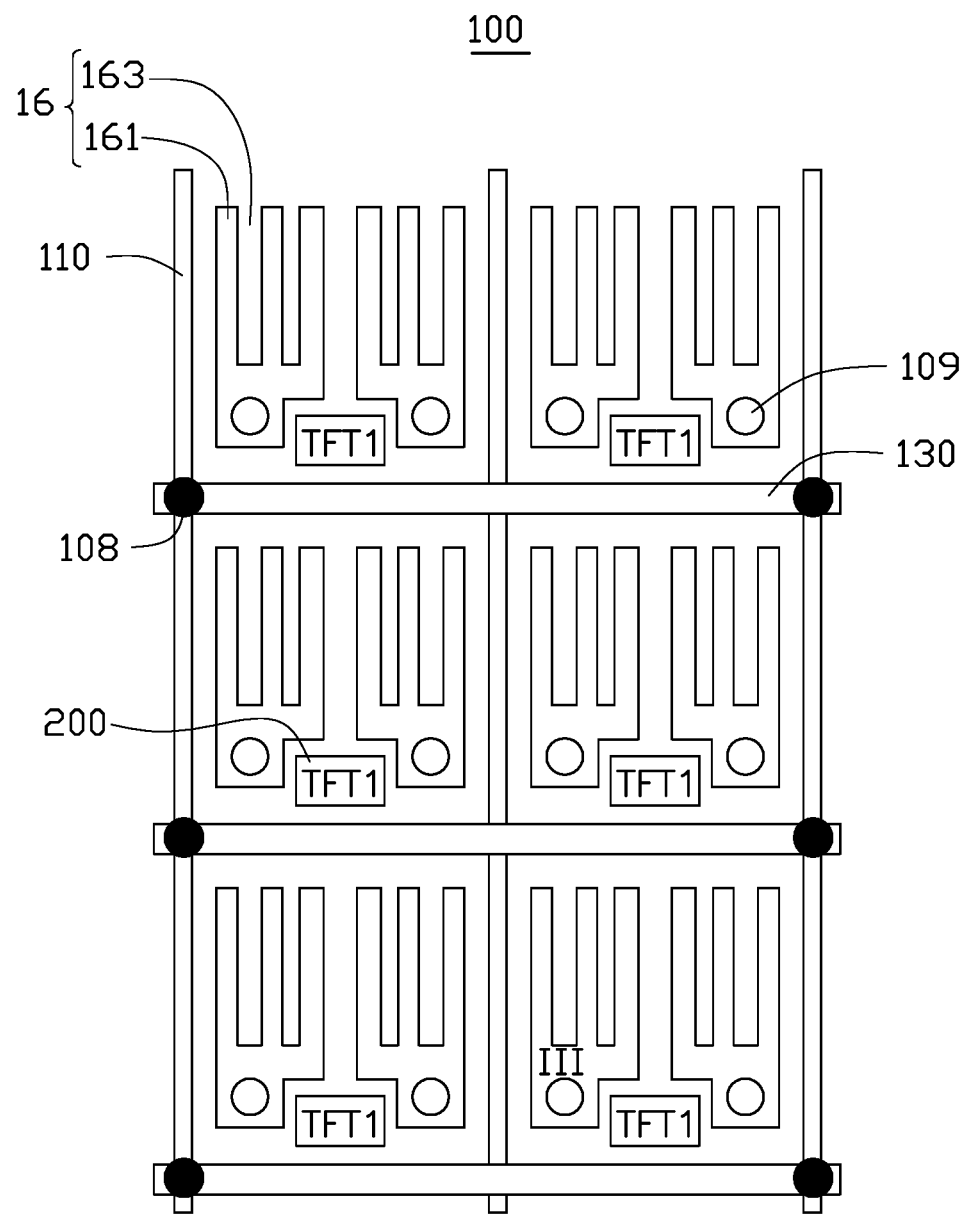
FIG. 6 is an enlarged view of section IV of FIG. 1.

The in-cell touch display panel 10 integrates a touchable structure into a display panel including a plurality of pixels. In the exemplary embodiment, the display panel includes a thin film transistor (TFT) array substrate, and the touchable structure is integrated into the TFT array substrate. The in-cell touch display panel 10 can be, for example, a liquid crystal display (LCD) panel. The touchable structure includes a plurality of touch sensor units 100 and a readout circuit 300 connected to the touch sensor units 100. The touch sensor units 100 are arranged in a matrix and spaced from each other. Each of the touch sensor units 100 is substantially rectangular and corresponds to at least two pixels. Each of the touch sensor units 100 comprises of a mesh pattern including a plurality of conductive wires 110, and a plurality of transparent conductive wires 130. The conductive wires 110 and the transparent conductive wires 130 cross each other in a grid. The conductive wires 110 are parallel with each other along a first direction X, and the transparent conductive wires 130 are parallel with each other along a second direction Y, Y being perpendicular to the first direction X. The conductive wires 110 have approximately the same lengths, and distances between any two adjacent conductive wires 110 are approximately same. In at least one exemplary embodiment, the conductive wires 110 and the transparent conductive wire 130 are arranged on different layers, and are electrically connected through a first hole 108. Each of the touch sensor units 100 forms a self-inductance touch sensing structure, and connects to the readout circuit 300 through a corresponding connecting line 180. The connecting line 180 connecting to one of the touch sensor units 100 is not connected to another one of touch sensor units 100 in the same column (as shown in FIG. 6). The connecting line 180 can be for example one of the conductive wires 110 or transparent conductive wires 130, or can be an independent conductive line connected to the touch sensor unit 100. In at least one exemplary embodiment, an area of size of each of the touch sensor units 100 is constant.

Figure 2:
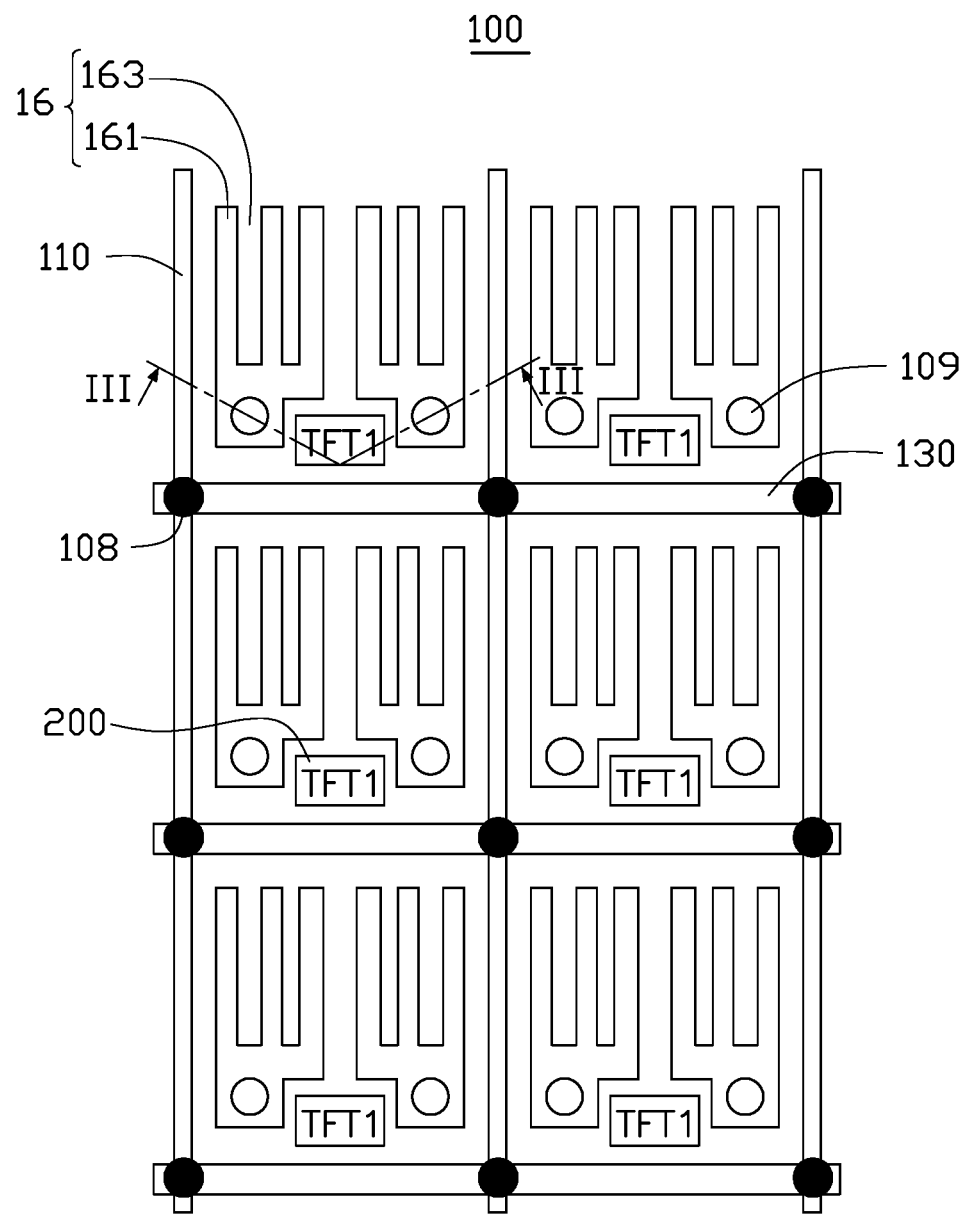
FIG. 2 is an enlarged view of section II of FIG. 1.

FIG. 2 illustrates part of the pixels of the in-cell touch display panel 10. In FIG. 2, two columns of touch sensor units 100 are shown. Each pixel includes several sub-pixels. In the exemplary embodiment, each pixel includes four different colored sub-pixels arranged as a 2×2 matrix. A minimum grid of the touch sensor unit 100 defined by the crossed conductive wire 110 and the transparent conductive wire 130 corresponds to two sub-pixels adjacent to each other. Each of the sub-pixels includes a pixel electrode 16, and a TFT structure 200 configured to simultaneously drive the two sub-pixels. The pixel electrodes 16 in the two sub-pixels are symmetrically arranged along the first direction X. In the minimum grid of the touch sensor unit 100, the pixel electrodes 16 and the corresponding TFT structure 200 are separated from each other. Each pixel electrode 16 includes a main electrode 161. The main electrode 161 defines a plurality of slits 163. Each of the pixel electrodes 161 is connected to the TFT structure 200 through a second hole 109. In other embodiments, the pixel electrodes 16 in the minimum grid of the touch sensor unit 100 can be controlled by two TFT structures 200 located between the two pixel electrodes 16 respectively.

Figure 3:
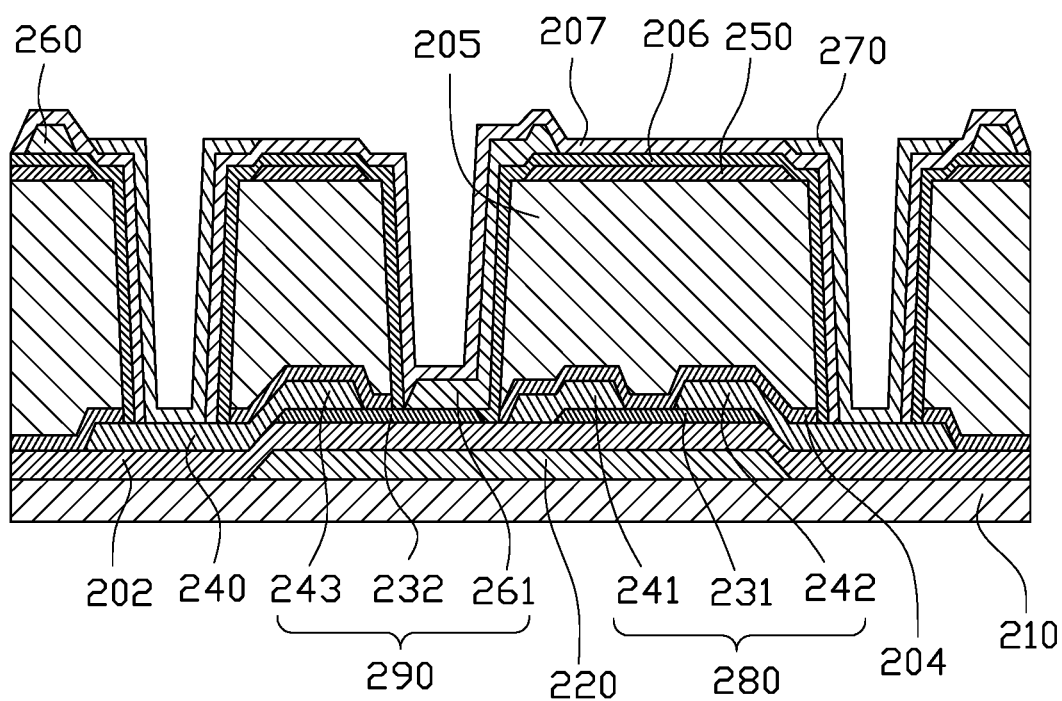
FIG. 3 is a cross-sectional view of the TFT structure of FIG. 2, taken along a line the TFT structure comprises a first conductive layer, a second conductive layer, and a third conductive layer.

FIG. 3 illustrates the TFT structure 200 of the sub-pixels of FIG. 1. The TFT array substrate of the in-cell touch display panel 10 may include a plurality of TFT structures 200 shown in FIG. 3.

The TFT structure 200 includes a substrate 210, a first conductive layer 220 formed on the substrate 210, a first insulation layer 202, and a first semiconductor layer 231 on the first insulation layer 202. A second semiconductor layer 232 is formed on the first insulation layer 202, and a second conductive layer 240 is formed on the first insulation layer 202 and the first semiconductor layer 231. A second insulation layer 204 covers the second conductive layer 240, the first semiconductor layer 231, and the second semiconductor layer 232. A third insulation layer 205 is formed on the second insulation layer 204, and a first transparent conductive layer 250 is formed on the third insulation layer 205. A fourth insulation layer 206 covers the first transparent conductive layer 250 and the third insulation layer 203. A third conductive layer 260 is formed on the fourth insulation layer 206, and a fifth insulation layer 207 covers the fourth insulation layer 206. A second transparent conductive layer 270 is formed on the fifth insulation layer 207. The first semiconductor layer 231 and the second semiconductor layer 232 of the first conductive layer 220 are coplanar, but spaced from each other. The second insulation layer 204 covers the first semiconductor layer 231, the second semiconductor layer 232, and the second conductive layer 240. The second transparent conductive layer 270 is patterned to form the transparent conductive wires 130.

Figure 4:
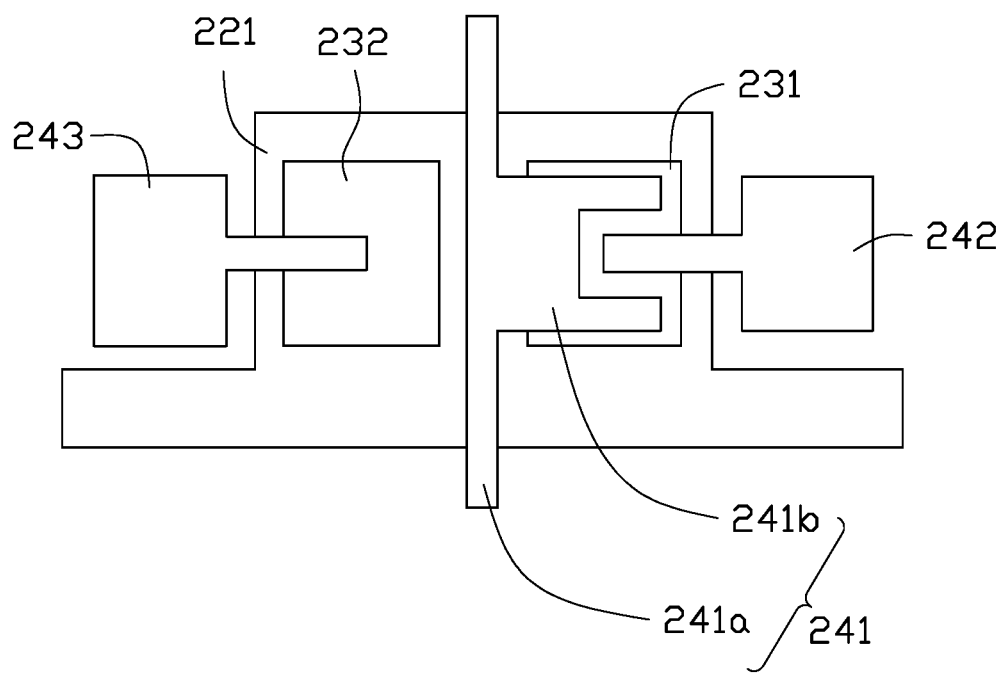
FIG. 4 is a plan view of the TFT structure of FIG. 3 before forming the third conductive layer.

The first conductive layer 220 formed on the substrate 210 may be patterned to form an array of first level signal conducting lines. For instance, the first conductive layer 220 may be patterned to form a first level signal conducting array/network over the substrate 210 (e.g., gate lines of the TFT array with portions). In some exemplary embodiments, portions of the first conductive layer 220 may be patterned to define a gate electrode 221 of the TFT structure 200 (as shown in FIG. 4). The first conductive layer 220 may selectively comprise aluminum (Al), silver (Ag), gold (Au), cobalt (Co), chromium (Cr), copper (Cu), indium (In), manganese (Mn), molybdenum (Mo), nickel (Ni), neodymium (Nd), palladium (pd), platinum (Pt), titanium (Ti), tungsten (W), zinc (Zn), or other suitable conductive materials, or a suitable mixture/alloy thereof. For achieving higher optical efficiency, in some exemplary embodiments, the first conductive layer 220 may include a transparent conductive material, such as indium tin oxide (ITO), indium zinc oxide (IZO), aluminum doped zinc oxide (AZO), or a suitable combination thereof.

The first insulation layer 202 is a gate insulation layer. The first insulating layer 202 may be laid over selected regions of the first conductive layer 202 to structurally protect the gate electrode 221 (and/or the first level signal conducting lines) and electrically shield the gate region of the TFT structure 200 from shorting with other parts of the structure. The insulating layer 202 may selectively comprise a suitable dielectric material, such as silicon oxide (SiOx), silicon nitride (SiNx), silicon oxynitride (SiOxNy), aluminum oxide (AlOx), yttrium oxide (Y2O3), hafnium oxide (HfOx), zirconium oxide (ZrOx), aluminum nitride (AlN), aluminum oxynitride (AlNO), titanium oxide (TiOx), barium titanate (BaTiO3), or lead titanate (PbTiO3).

The second conductive layer 240 covers a part of the first semiconductor layer 231 and the second semiconductor layer 232, and is patterned to define a first source electrode 241, a first drain electrode 242, and a second drain electrode 243 of the TFT structure 200. In one exemplary embodiment, the second conductive layer 240 may be part of the signal conducting network that interconnects an array of pixels. For example, the second conductive layer 240 may be patterned to form a second level signal conducting array/network on the substrate 210 (e.g., data lines of the TFT array) and another region (e.g., a data line driving IC) defined over the substrate 210. The first source electrode 241 and the first drain electrode 242 are electrically connected to opposite ends of the first semiconductor layer 231. The first source electrode 241, the first drain electrode 242, the first semiconductor layer 231, and the gate electrode 221 constitute a first TFT 280. Referring to FIG. 4, the first source electrode 241 further comprises a first connecting portion 241a electrically connected to a data line of the TFT array and a first main portion 241b extending from the first connecting portion 241a, the first main portion 241b laterally is extended to an area defined by the sub-pixel. In the exemplary embodiment, the first connecting portion 241a can be for example a part of the data line, and can be located in a gap between the first semiconductor layer 231 and the second semiconductor layer 232. The first main portion 241b covers one end of the first semiconductor layer 231.

The first transparent conductive layer 250 is a common voltage layer 16. In other embodiments, the first transparent conductive layer 250 can disposed on an opposite substrate of the in-cell touch display panel.

Figure 5:
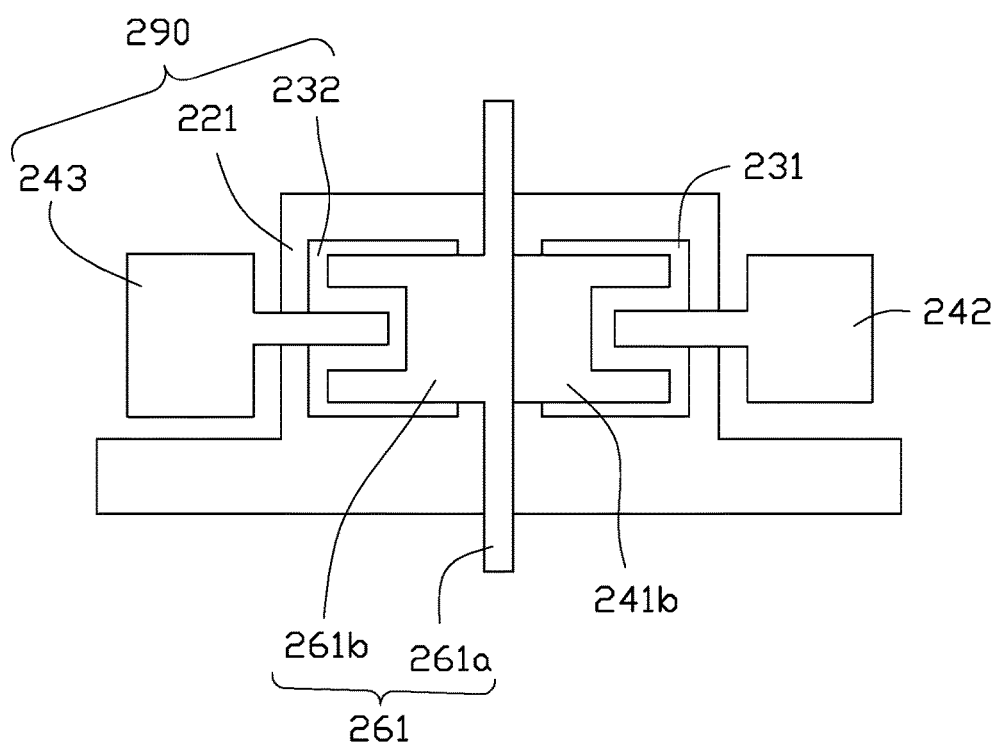
FIG. 5 is a plan view of the TFT structure of FIG. 3 with third conductive layer.

The third conductive layer 260 is patterned to form the conductive wires 110 and a second source electrode 261 of the TFT structure 200 not connected to the conductive wires 110. Referring to FIG. 5, the second source electrode 261 includes a second connecting portion 261a and a second main portion 261b. The second connecting portion 261a connects to a data line at the point where the first connecting portion 241a connects. The second main portion 261b extends from the second connecting portion 261a and electrically connects to the data line. In the exemplary embodiment, the second connecting portion 261a overlaps the first connecting portion 241a, and the second main portion 261b covers one end of the second semiconductor layer 232. The second drain electrode 243 is formed to cover an opposite end of the semiconductor layer 232. The second source electrode 261, the second drain electrode 243, the second semiconductor layer 232, and the gate electrode 221 constitute a second TFT 290. In at least one exemplary embodiment, the third conductive layer 260 is also patterned to form the connecting lines 180. The connecting line 180 is staggered in relation to the first TFT 280, the gate electrode 221, and staggered in relation to the second TFT 290 along a direction perpendicular to the TFT structure 200.

The second transparent conductive layer 270 is patented to form a plurality of pixel electrodes 16. The second transparent conductive layer 270 and the first transparent conductive layer 250 are insulated disposed to form a horizontal electric field for driving crystals. In at least one embodiment, the horizontal electric field is a in-plane switch (IPS).

The first TFT 280 or the second TFT 290 switches the two adjacent sub-pixels. In this exemplary embodiment, an extending direction of the conductive wires 110 is substantially the same as an extending direction of the data lines. In this exemplary embodiment, the extending direction of the transparent conductive wires 130 is substantially the same as an extending direction of the gate line. The transparent conductive wires 130 are located above the gate lines.

Either of the main electrodes 161 of the two adjacent sub-pixels are electrically connected to the first drain electrode 242 or the second drain electrode 243 through the second hole 109. Such connections are made through the fifth insulation layer 207, the fourth insulation layer 206, and the second insulation layer 204.

The described structure of the in-cell touch display panel 10 avoids any overlapping of the data line patterned by the second conductive layer 240 and the connecting line 180 of the third conductive layer 260. The in-cell touch display panel 10 can simultaneously work under a display period and a touch period for increasing a touch operation detecting time. Further, one TFT structure 200 simultaneously drives two sub-pixels, therefore a high resolution and aperture ratio of the touch display panel 10 are improved.

Figure 7:
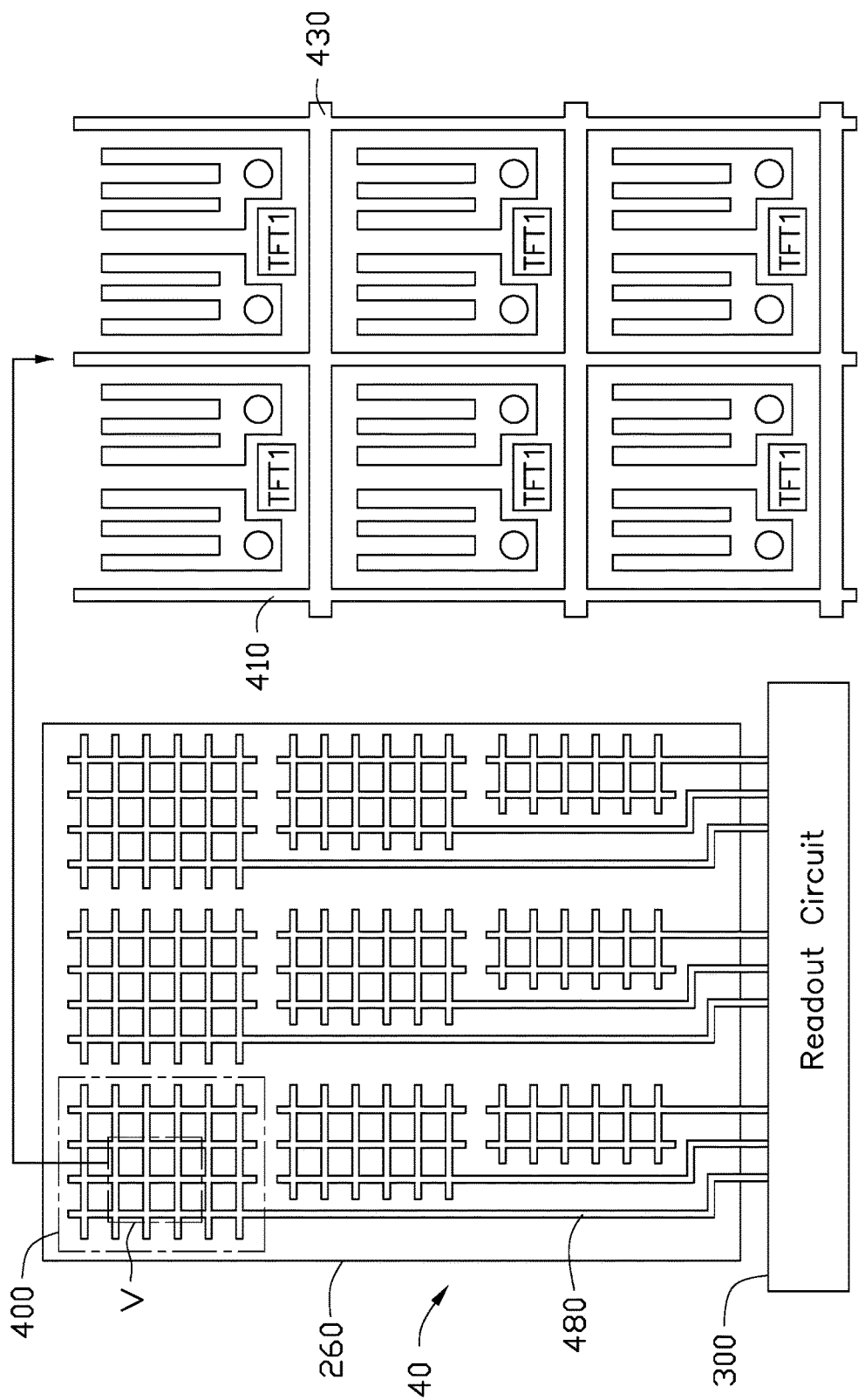
FIG. 7 is a plan view of an in-cell touch display panel according to a second exemplary embodiment, enlarged section V is shown on the right-hand side.
Figure 8:
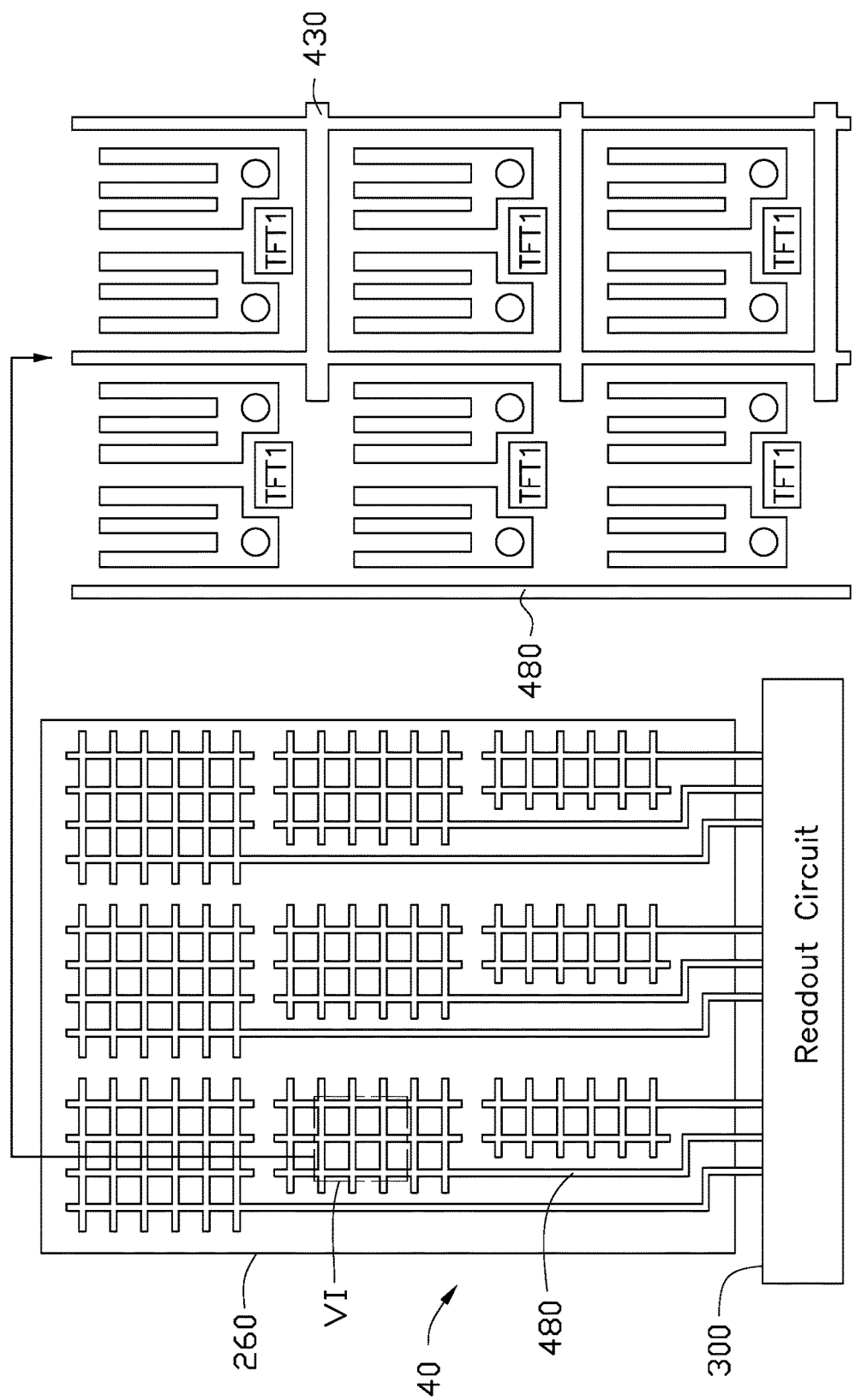
FIG. 8 is a plan view of an in-cell touch display panel of FIG. 7 according to the second exemplary embodiment, enlarged section VI shown on the right-hand side.

FIGS. 7-8 are plan view of an in-cell touch display panel 40 according to a second exemplary embodiment. The in-cell touch display panel 40 according to the second exemplary embodiment is approximately the same as the in-cell touch display panel 10. The differences between the in-cell touch display panel 40 and the in-cell touch display panel 10 will now be described. The touch sensor units 400 according to the second exemplary embodiment are different from the touch sensor units 100. Each of the touch sensor units 400 are positioned to form a mesh pattern. A plurality of first conductive wires 410 extends along a first direction X and a plurality of second conductive wires 430 extends along a second direction Y perpendicular to the first direction X. The first conductive wires 410 and the second conductive wires 430 are formed by patterning the same third conductive layer 260. Areas of the touch sensor units 400 gradually reduce along a direction extending to the readout circuit 300. Each of the touch sensor units 400 forms a self-inductance touch sensing structure and connects to the readout circuit 300 through a connecting line 480. The connecting line 480 connecting to one of the touch sensor units 400 is not connected to another one of touch sensor units 400 at the same column. The connecting line 480 can be one of the first conductive wires 410 or can be an independent conductive line connected to the touch sensor units 400. The connecting lines 480 are positioned on the same side of the touch sensor unit 400. In this exemplary embodiment, the connecting lines 480 are positioned on the left side of the touch sensor unit 400. In this exemplary embodiment, the second transparent conductive layer 270 does not need to include the transparent conductive wires 130 of the first exemplary embodiment.

Figure 9:
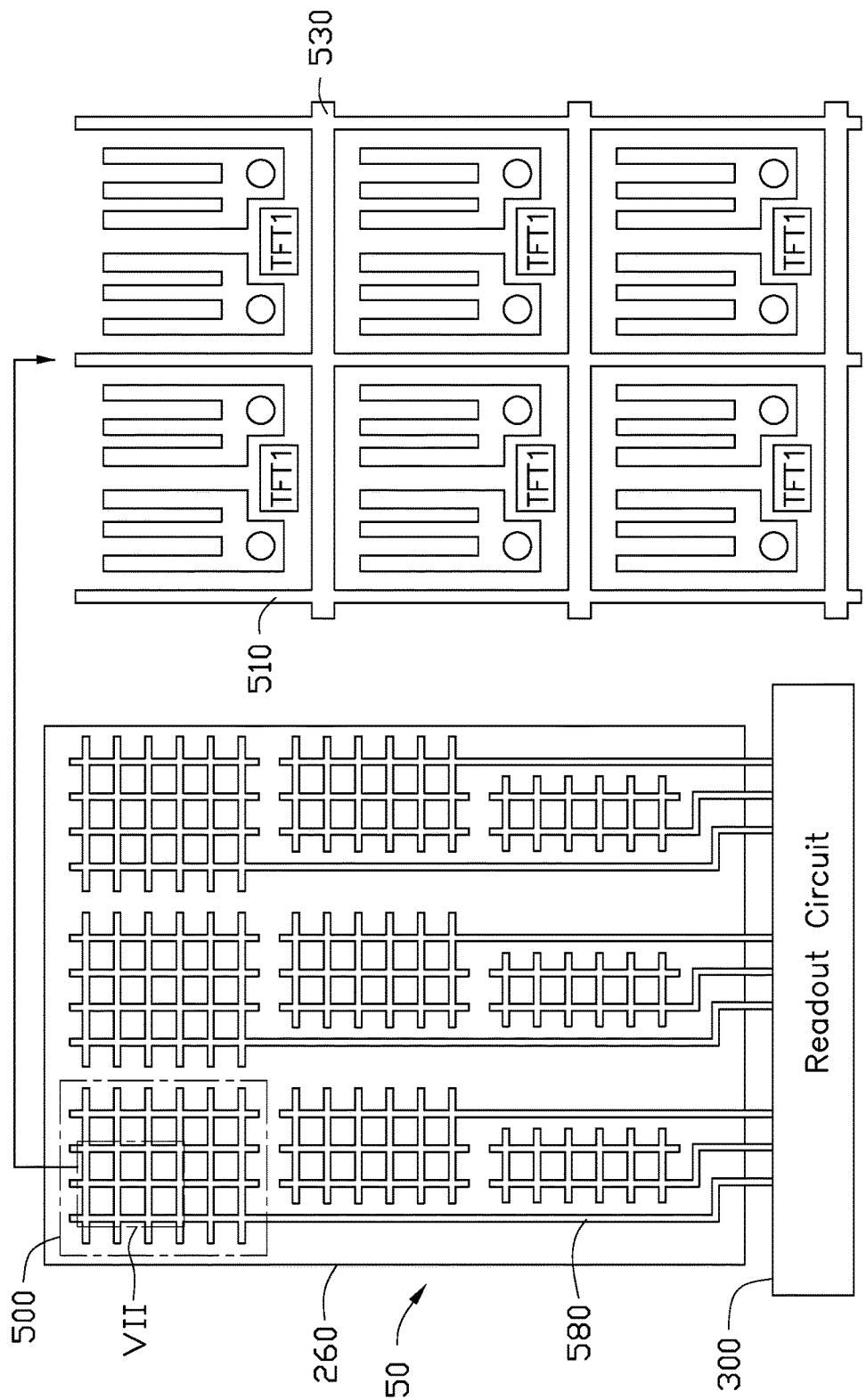
FIG. 9 is a plan view of an in-cell touch display panel according to a third exemplary embodiment, enlarged section VII is shown on the right-hand side.
Figure 10:
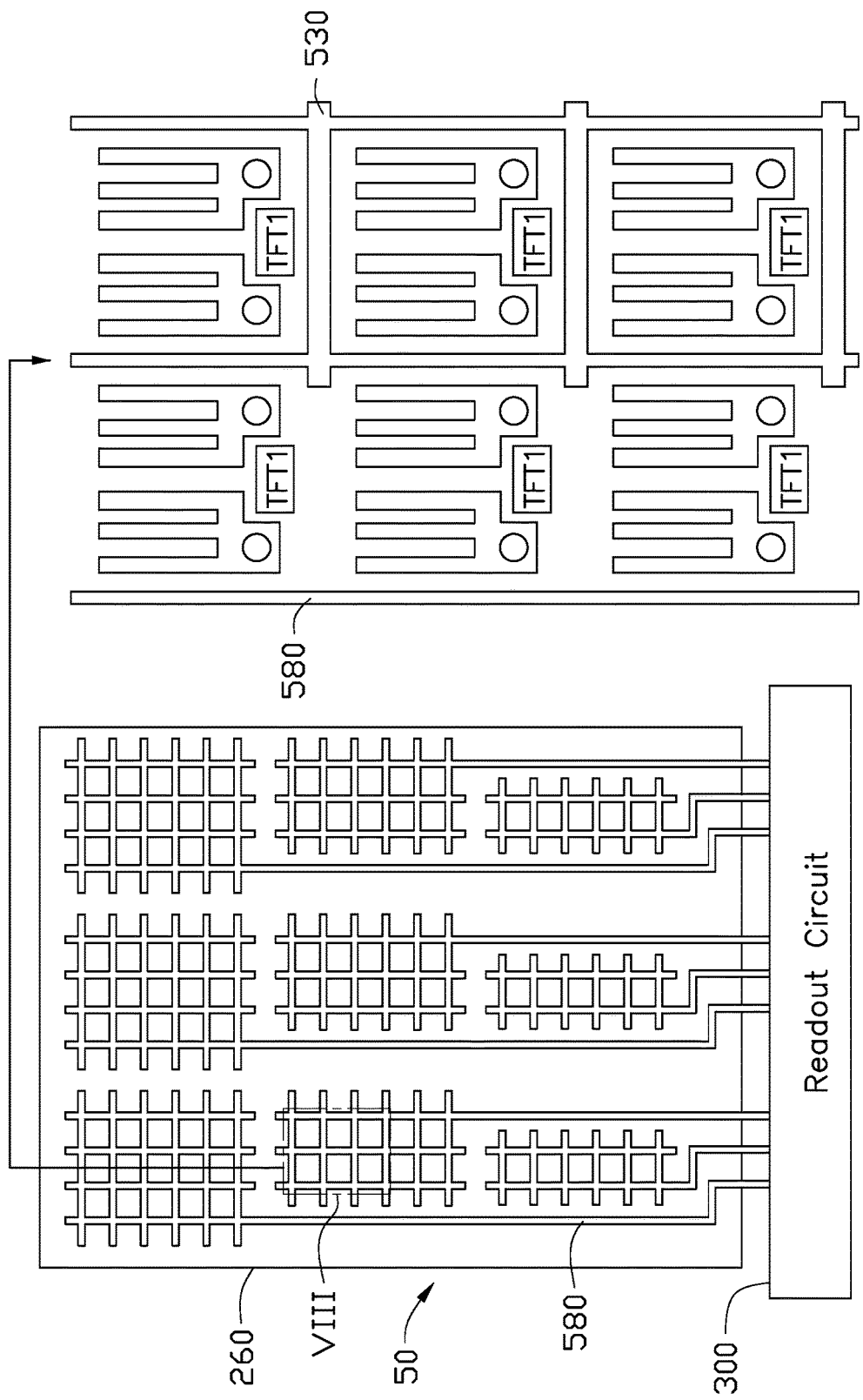
FIG. 10 is a plan view of an in-cell touch display panel of FIG. 9 according to a third exemplary embodiment, enlarged section VIII is shown on the right-hand side.

FIGS. 9-10 are plan views of an in-cell touch display panel 50 according to a third exemplary embodiment. The in-cell touch display panel 50 according to the third exemplary embodiment is approximately the same as the in-cell touch display panel 10. The differences between the in-cell touch display panel 50 and the in-cell touch display panel 10 are hereinafter described. The touch sensor units 500 according to the third exemplary embodiment are different from the touch sensor units 100. Each touch sensor units 500 forms a mesh pattern, and includes a plurality of first conductive wires 510 extending along the first direction X and a plurality of second conductive wires 530 extending along the second direction Y. The first conductive wires 510 and the second conductive wires 530 are formed by patterning the same third conductive layer 260. Areas of the touch sensor units 500 gradually reduce along a direction extending to the readout circuit 300. Each of the touch sensor units 500 forms a self-inductance touch sensing structure, and connects to the readout circuit 300 through a corresponding connecting line 580. The connecting line 580 connecting to one of the touch sensor units 500 is not connected to other touch sensor units 500 at the same column. The connecting line 580 can be one of the first conductive wires 510 or can be an independent conductive line connected to the touch sensor unit 500. The connecting lines 580 of two adjacent touch sensor units 500 are positioned on opposite sides of the touch sensor units 500. In this exemplary embodiment, one of the connecting lines 580 connected to the readout circuit 300 is positioned on the left side of the corresponding touch sensor units 500, and the other connecting line 580 connected to the readout circuit 300 is positioned on the right side of the touch sensor units 500. In this exemplary embodiment, the second transparent conductive layer 270 does not need the transparent conductive wires 130 of the first exemplary embodiment.

Figure 11:
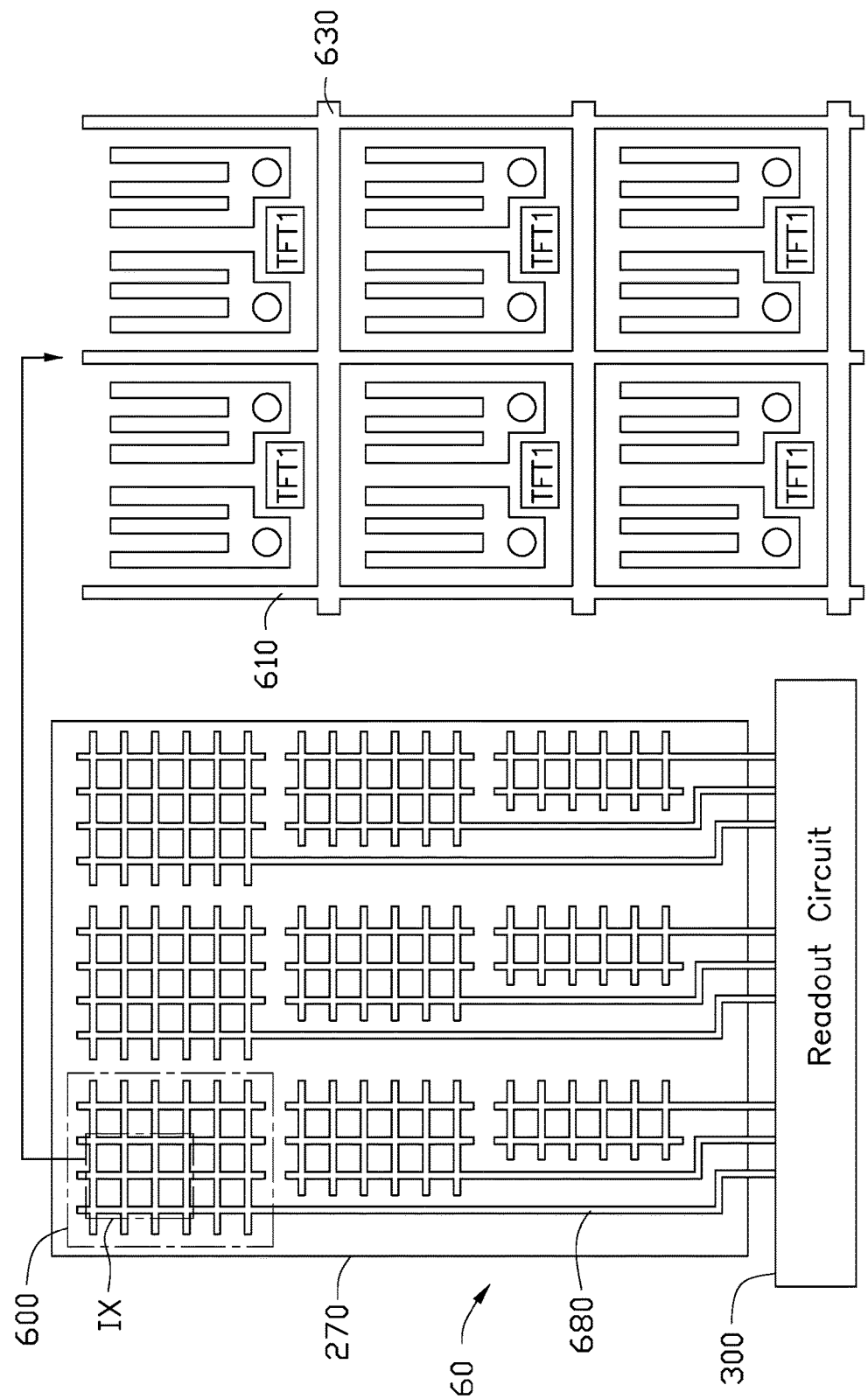
FIG. 11 is a plan view of an in-cell touch display panel according to a fourth exemplary embodiment, enlarged section IX is shown on the right-hand side.
Figure 12:
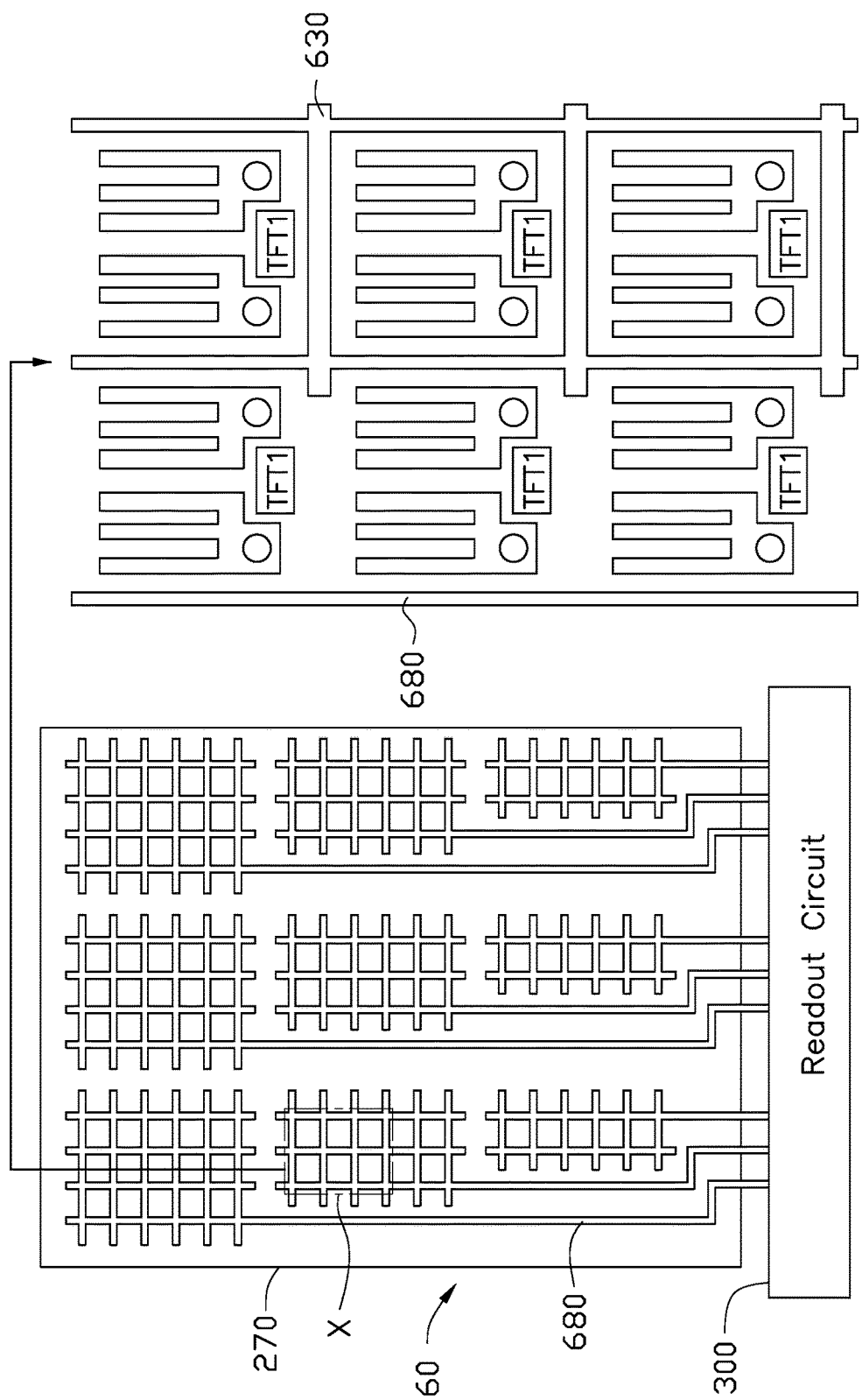
FIG. 12 is a plan view of an in-cell touch display panel of FIG. 11 according to a fourth exemplary embodiment, enlarged section X is shown on the right-hand side.

FIGS. 11-12 are plane views of an in-cell touch display panel 60 according to a fourth exemplary embodiment. The in-cell touch display panel 60 according to the fourth exemplary embodiment is approximately the same as the in-cell touch display panel 10. The differences between the in-cell touch display panel 60 and the in-cell touch display panel 10 will now be described. The touch sensor units 600 according to the fourth exemplary embodiment are different from the touch sensor units 100. Each of the touch sensor units 600 forms a mesh pattern, and includes a plurality of first transparent conductive wires 610 extending along the first direction X and a plurality of second transparent conductive wires 630 extending along the second direction Y. The first transparent conductive wires 610 and the second transparent conductive wires 630 are formed by patterning the second transparent conductive layer 270. Areas of the touch sensor units 600 gradually reduce along a direction extending to the readout circuit 300. Each of the touch sensor units 600 forms a self-inductance touch sensing structure, and connects to the readout circuit 300 through a corresponding connecting line 680. The connecting line 680 connecting to one of the touch sensor units 600 is not connected to another one of touch sensor units 600 at the same column. The connecting line 680 can be one of the first conductive wires 610 or can be an independent conductive line connected to the touch sensor units 600. The connecting lines 680 are positioned on the same side of the touch sensor units 600. In this exemplary embodiment, the connecting lines 680 are positioned on the left side of the touch sensor units 600. In this exemplary embodiment, the third conductive layer 260 does not need the conductive wires 110 of the first exemplary embodiment.

Figure 13:
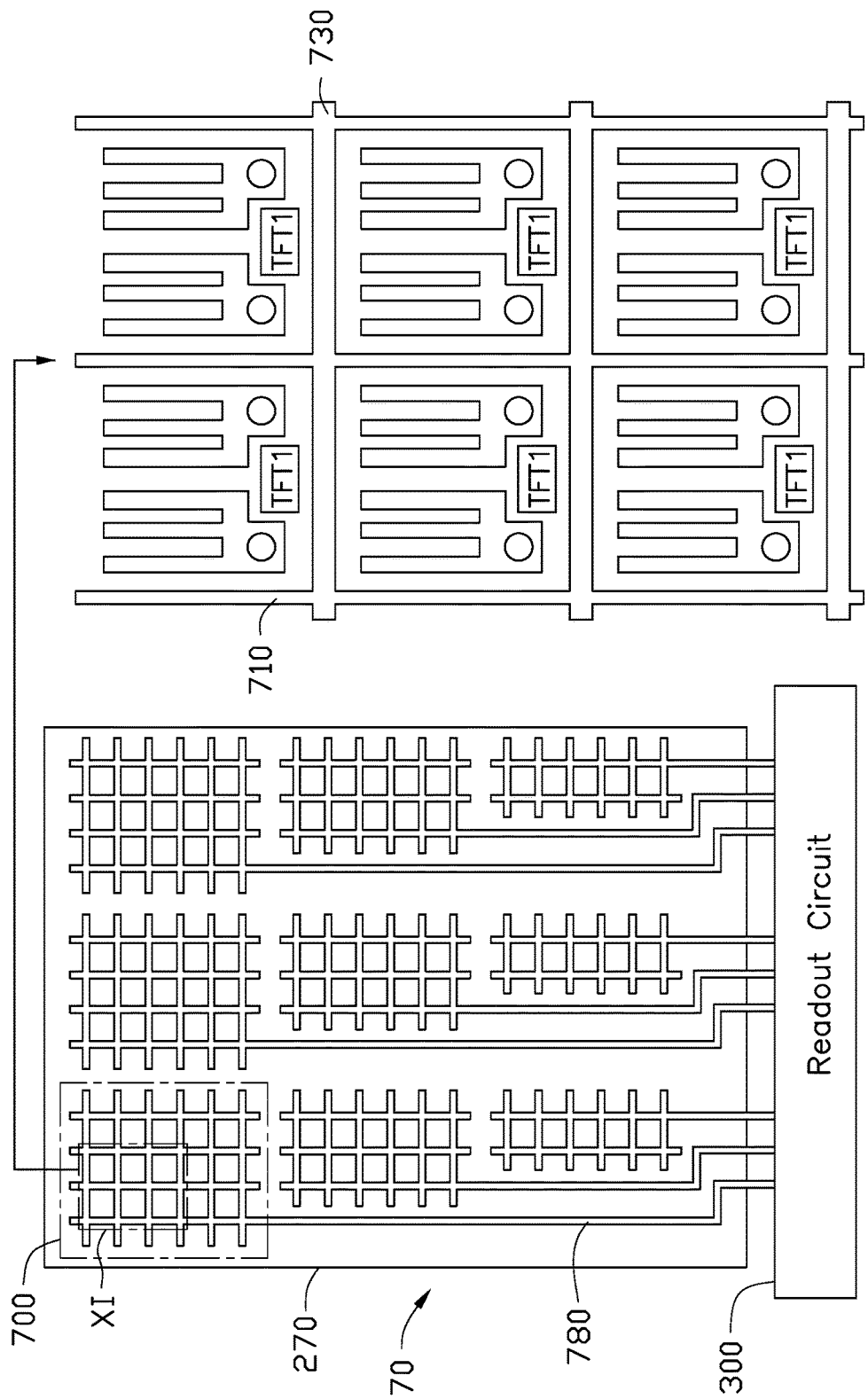
FIG. 13 is a plan view of an in-cell touch display panel according to a fifth exemplary embodiment, enlarged section XI is shown on the right-hand side.
Figure 14:
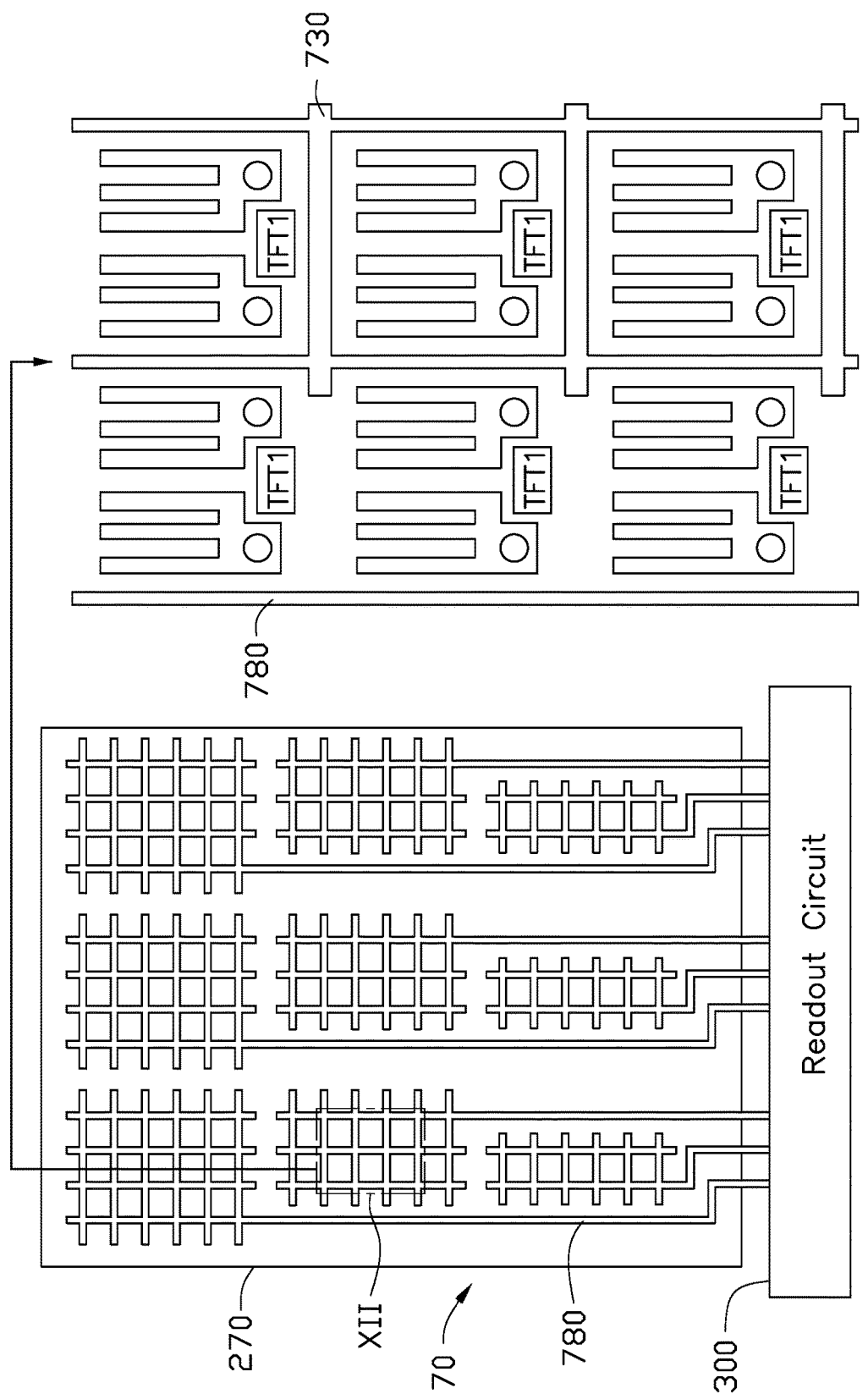
FIG. 14 is a plan view of an in-cell touch display panel of FIG. 14 according to the fourth exemplary embodiment, enlarged section XII is shown on the right-hand side.

FIGS. 13-14 are plane views of an in-cell touch display panel 70 according to a fifth exemplary embodiment. The in-cell touch display panel 70 according to the fifth exemplary embodiment is approximately same with the in-cell touch display panel 10. The differences between the in-cell touch display panel 70 and the in-cell touch display panel 10 will now be described. The touch sensor units 700 according to the fifth exemplary embodiment are different from the touch sensor units 100. Each of the touch sensor units 700 are positioned to form a mesh pattern, and includes a plurality of first transparent conductive wires 710 extending along the first direction X and a plurality of second transparent conductive wires 730 extending along the second direction Y. The first transparent conductive wires 710 and the second transparent conductive wires 730 are formed by patterning the second transparent conductive layer 270. Areas of the touch sensor units 700 gradually reduce along a direction extending to the readout circuit 300. Each of the touch sensor units 700 forms a self-inductance touch sensing structure, and connects to the readout circuit 300 through a corresponding connecting line 780. The connecting line 780 connecting to one of the touch sensor units 700 is not connected to another one of touch sensor units 700 at the same column. The connecting line 780 can be one of the first conductive wires 710 or can be an independent conductive line connected to the touch sensor units 700. The connecting lines 780 of two adjacent touch sensor units 700 are located on opposite sides of the touch sensor units 700. In this exemplary embodiment, one of the connecting line 780 connected to the readout circuit 300 is positioned on the left side of the corresponding touch sensor units 700, and the other connecting line 780 connected to the readout circuit 300 is positioned on the right side of the touch sensor units 700. In this exemplary embodiment, the third conductive layer 260 does not need the conductive wires 110 of the first exemplary embodiment.

While various exemplary and preferred exemplary embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A thin film transistor (TFT) substrate comprising:
   a first conductive layer, the first conductive layer patterned forming a plurality of gate electrodes;
   a first semiconductor layer formed over the first conductive layer, the first semiconductor layer insulated from the first conductive layer;
   a second semiconductor layer formed over the first conductive layer and insulated from the first conductive layer, the second semiconductor layer coplanar with the first semiconductor layer;
   a second conductive layer formed over the first semiconductor layer and the second semiconductor layer, and patterned forming a plurality of first drain electrodes, a plurality of second drain electrodes, and a plurality of first source electrodes;
   a first transparent conductive layer formed over the second conductive layer and serving as a common voltage layer, the first transparent conductive layer insulated from the second conductive layer;
   a third conductive layer formed over the first transparent conductive layer, the third conductive layer patterned forming a plurality of second source electrodes; and
   wherein the TFT substrate further comprises a plurality of touch sensor units positioned in a matrix; each of the plurality of touch sensor units comprises a plurality of first wires and a plurality of second wires crossed with the plurality of first wires forming a metal mesh pattern; the plurality of touch sensor units are spaced at an interval from each other; an area surrounded by two of the adjacent plurality of first wires and two of the adjacent plurality of second wires crossed with the two of the adjacent plurality of first wires is defined as a minimum grid area;
   wherein the minimum grid area comprises two sub-pixel electrodes and a TFT structure; the TFT structure simultaneously drives the two sub-pixel electrodes in the same minimum grid area; the TFT structure comprises two TFTs; the two TFTs in a same minimum grid area shares a specified gate electrode of the plurality of the gate electrodes as a common gate electrode;
   wherein one of the two TFTs is comprised of the specified gate electrode, the first drain electrode of the second conductive layer positioned on the specified gate electrode, and the first source electrode of the second conductive layer positioned on the specified gate electrode, another of the two TFTs is comprised of the specified gate electrode, the second source electrode of the third conductive layer positioned on the specified gate electrode, and the second drain of the second conductive layer positioned on the specified gate electrode.

2. The TFT substrate of claim 1, wherein each of the plurality of touch sensor units connects to a readout circuit through a connecting line; the connecting line is staggered with the TFT structure along a direction perpendicular to the TFT structure; the plurality of first wires and the plurality of second wires are electrically connected to each other for detecting touch operations at a position corresponding to a junction of the plurality of first wires and the plurality of second wires.

3. The TFT substrate of claim 2, wherein the plurality of first wires are formed by patterning the third conductive layer; the plurality of second wires are formed by patterning a second transparent conductive layer; the second transparent conductive layer is formed over the second conductive layer; the plurality of first wires are conductive wires, and the plurality of second wires are transparent conductive wires; the connecting line is one of the plurality of first wires extending along a first direction.

4. The TFT substrate of claim 3, wherein the connecting lines of the plurality of touch sensor units in a same column are respectively positioned on a same side of each of the plurality touch sensor units.

5. The TFT substrate of claim 3, wherein the connecting lines of two of the adjacent plurality of touch sensor units in a same column are respectively located on opposite sides of the two of the adjacent plurality of touch sensor units.

6. The TFT substrate of claim 2, wherein the plurality of first wires and the plurality of second wires are formed by patterning the third conductive layer; the connecting lines extend along a first direction.

7. The TFT substrate of claim 6, wherein the connecting lines of the plurality of touch sensor units in a same column are respectively positioned on a same side of each of the plurality of touch sensor units.

8. The TFT substrate of claim 6, wherein the connecting lines of two of the adjacent plurality of touch sensor units in a same column are respectively positioned on opposite sides of the two of the adjacent plurality of touch sensor units.

9. The TFT substrate of claim 2, wherein the plurality of first wires and the plurality of second wires are formed by patterning a second transparent conductive layer; the connecting lines extend along a first direction.

10. The TFT substrate of claim 9, wherein the connecting lines of the plurality of touch sensor units in a same column are respectively positioned on a same side of each of the plurality of touch sensor units.

11. The TFT substrate of claim 9, wherein the connecting lines of two of the adjacent plurality of touch sensor units are respectively positioned on opposite sides of the two of the adjacent plurality of touch sensor units.

12. The TFT substrate of claim 1, wherein an area of each of the plurality of touch sensor units is constant.

13. The TFT substrate of claim 1, wherein areas of the plurality of touch sensor units in a same column are gradually reduced along a direction extending towards the readout circuit.

14. An in-cell touch display panel, comprising:
a plurality of touch sensor units positioned in a matrix, the plurality of touch sensor units comprising:
a plurality of first wires;
a plurality of second wires crossed with the plurality of first wires forming a metal mesh, the plurality of second wires cooperate together with the plurality of first wires to detect touch operations;
wherein the plurality of first wires and the plurality of second wires are electrically connected to each other for detecting touch operations at a position corresponding to an junction of the plurality of first wires and the plurality of second wires; an area surrounded by two of the adjacent plurality of first wires and two of the adjacent plurality of second wires crossed with the two of the adjacent plurality of first wires is defined as a minimum grid area;
wherein the minimum grid area comprises two sub-pixel electrodes and a TFT structure; the TFT structure simultaneously drives the two sub-pixels electrodes in the same minimum grid area; each of the plurality of touch sensor units connects to a readout circuit through a corresponding connecting line; the connecting line is staggered with the TFT structure along a direction perpendicular to the TFT structure; the TFT structure comprise two TFTs; the two TFTs in a same minimum grid area shares a specified gate electrode of the plurality of the gate electrodes as a common gate electrode.

15. The in-cell touch display panel of claim 14, wherein each of the plurality of touch sensor unit comprises a first conductive layer, a first semiconductor layer, a second semiconductor layer, a second conductive layer, a first transparent conductive layer, and a third conductive layer; the first conductive layer is patterned forming a plurality of gate electrodes; the first semiconductor layer and the second semiconductor layer are insulated from the first conductive layer, the first semiconductor layer and the second semiconductor layer are formed over the first conductive layer, and coplanar with each other; the second conductive layer is formed over the first semiconductor layer and the second semiconductor layer; the second conductive layer is patterned forming a plurality of first drain electrodes, a plurality of second drain electrodes, and a plurality of first source electrodes; the first transparent conductive layer is formed over the second conductive layer and serving as a common voltage layer; the third conductive layer is formed over the first transparent conductive layer; the third conductive layer is patterned forming a plurality of second source electrodes; one of the two TFTs is comprised of the specified gate electrode, the first drain electrode of the second conductive layer positioned on the specified gate electrode, and the first source electrode of the second conductive layer positioned on the specified gate electrode, another of the two TFTs is comprised of the specified gate electrode, the second source electrode of the third conductive layer positioned on the specified gate electrode, and the second drain of the second conductive layer positioned on the specified gate electrode; the TFT structure is formed on a layer different from a layer forming the plurality of first wires and the plurality of second wires.

16. The in-cell touch display panel of claim 15, wherein the plurality of first wires are formed by patterning the third conductive layer; the plurality of second wires are formed by patterning a second transparent conductive layer; the plurality of first wires are conductive wires, and the plurality of second wires are transparent conductive wires; the connecting line is one of the plurality of first wires extending along a first direction.

17. The in-cell touch display panel of claim 15, wherein areas of the plurality of touch sensor units are constant.

18. The in-cell touch display panel of claim 17, wherein the connecting lines of the plurality of touch sensor units in a same column are positioned on a same side of each of the plurality of touch sensor units.

19. The in-cell touch display panel of claim 17, wherein the connecting lines of two of the adjacent plurality of touch sensor units in a same column are located on opposite sides of the two of the adjacent plurality of touch sensor units.

20. The in-cell touch display panel of claim 15, wherein areas of the plurality of touch sensor units in a same column are gradually reduced along a direction extending to the readout circuit; the plurality of first wires and the plurality of second wires are formed by patterning the third conductive layer; the connecting lines extend along a first direction.

21. The in-cell touch display panel of claim 20, wherein the connecting lines of the plurality of touch sensor units in a same column are positioned on a same side of each of the plurality of touch sensor units.

22. The in-cell touch display panel of claim 20, wherein the connecting lines of two of the adjacent plurality of touch sensor units in a same column are respectively located on opposite sides of the two of the adjacent plurality of touch sensor units.

23. The in-cell touch display panel of claim 15, wherein areas of the plurality of touch sensor units in a same column are gradually reduced along a direction extending to the readout circuit; the plurality of first wires and the plurality of second wires are formed by patterning a second transparent conductive layer; the connecting lines extend along a first direction.

24. The in-cell touch display panel of claim 23, wherein the connecting lines of the plurality of touch sensor units in a same column are respectively positioned on a same side of each of the plurality of touch sensor units.

25. The in-cell touch display panel of claim 23, wherein the connecting lines of two of the adjacent plurality of touch sensor units in a same column are respectively located on opposite sides of the two of the adjacent plurality of touch sensor units.

* * * * *